Figure 1:
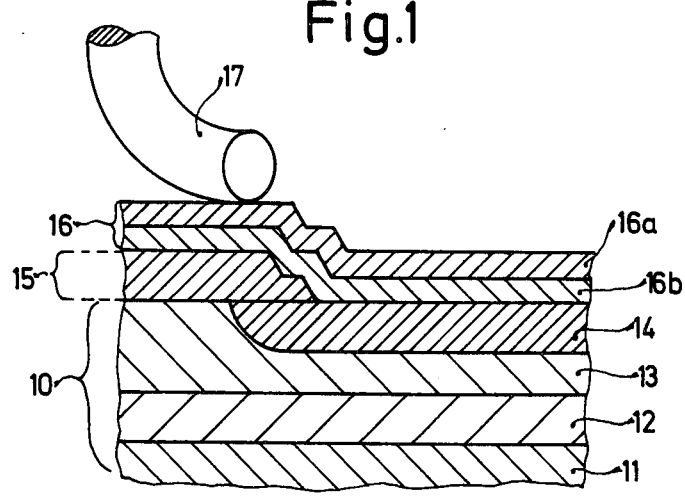

United States Patent [19]

Schnepf et al.

[11] 4,151,545
[45] Apr. 24, 1979

[54] SEMICONDUCTOR ELECTRIC CIRCUIT DEVICE WITH PLURAL-LAYER ALUMINUM BASE METALLIZATION

[75] Inventors: Dietmar Schnepf, Esslingen; Klaus Reindl, Pfullingen; Heiko Gruner, Gerlingen; Friedrich Vogel, Reutlingen, all of Fed. Rep. of Germany

[73] Assignee: Robert Bosch GmbH, Stuttgart, Fed. Rep. of Germany

[21] Appl. No.: 841,709

[22] Filed: Oct. 13, 1977

[30] Foreign Application Priority Data

Oct. 29, 1976 [DE] Fed. Rep. of Germany ....... 2649773

[51] Int. Cl.² .................. H01L 23/48; H01L 29/46; H01L 29/54
[52] U.S. Cl. ........................ 357/71; 357/65; 357/67; 357/59
[58] Field of Search ............ 357/65, 67, 68, 71, 357/59

[56] References Cited

U.S. PATENT DOCUMENTS

| 3,609,470 | 9/1971 | Kuiper | 357/67 |
| 3,716,469 | 2/1973 | Bhatt et al. | 357/67 |
| 3,740,835 | 6/1973 | Duncan | 357/67 |
| 3,830,657 | 8/1974 | Farrar | 357/67 |
| 3,863,334 | 2/1975 | Coleman | 357/67 |
| 3,879,840 | 4/1975 | Ames et al. | 357/67 |

*Primary Examiner*—Andrew J. James
*Attorney, Agent, or Firm*—Flynn & Frishauf

[57] ABSTRACT

A pure aluminum outer layer is provided to facilitate bonding with aluminum bonding wires having a diameter of 50 μm or greater without formation of troublesome slivers upon bonding. Beneath that a copper-bearing aluminum layer with 1 to 4% copper content is provided. A third layer beneath the copper-bearing layer containing up to 1% silicon can be added below the copper-bearing layer to promote adhesion at contact window edges.

7 Claims, 2 Drawing Figures

SEMICONDUCTOR ELECTRIC CIRCUIT DEVICE WITH PLURAL-LAYER ALUMINUM BASE METALLIZATION

This invention relates to a semiconductor electric circuit device, particularly of the monolithic integrated circuit type having a monocrystalline semiconductor chip or wafer body of silicon and zones of different conductivity and/or conductivity type in various surface areas of the body for provision of components of the circuit device. Such devices are conventionally partly covered by an insulating layer, usually of silicon oxide, which leaves uncovered, by windows therein, areas of the body or zones thereof for contact therewith, and there is also generally provided, above the insulating layer where that is also present, a patterned metallization layer providing circuit paths, contact through the contact windows of the insulating layers, and areas for application of external contact wires or other connection devices. Bonding wires are commonly provided to make contact with the metallization layer in suitable areas of the latter, in order to provide the necessary external connections to the circuit and components provided on or in the semiconductor body. These bonding wires are generally attached to the metallization layer by a pressure-bonding procedure.

Semiconductor electric circuit devices of the above-described kind are already known in which the metallization is composed of an aluminum layer and the bonding wires are made of aluminum wire. In such devices, particularly in the case of relatively thick aluminum wires (thickness > 50 μm), difficulty has been found in applying the bonding wires. Through friction of the wire against the aluminum layer, bond slivers are formed in the bonding operation which can lead to the formation of short-circuits between the various conducting paths of the metallization.

It is an object of the present invention to avoid the above-mentioned disadvantages of the known devices without resort to expedients bringing other disadvantages, as in the case of increased corrosion of aluminum and copper and poor quality of covering and of adherence to the window edges.

SUMMARY OF THE INVENTION

Briefly, the metallization layer is made up of at least three distinct layers, an outer layer of highly pure aluminum, a layer underlying the outer layer of copper-containing aluminum having a copper content of between 1 and 4% by weight and an inner layer beneath the copper-bearing aluminum layer made of aluminum that preferably has a small silicon content, up to 1% of silicon by weight. The inner layer just mentioned has an adhesion-promoting function that allows the steep edges or steps at the rim of contact windows to be better bridged over by the metallization path than in the case of metallization of which the bottom layer is copper-bearing aluminum.

Preferably the outer layer has a thickness of 0.5 to 1.5 μm, the layer immediately underlying it likewise, and the inner layer, a thickness of 0.3 to 0.5 μm. The bonding wires can be of aluminum and preferably have a thickness not less than 50 μm.

Figure 2:
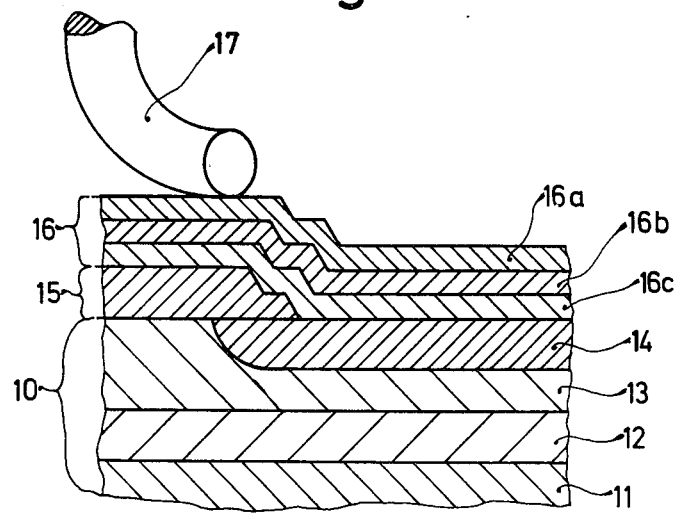

The invention is further described by way of illustrative example with reference to the annexed drawings, in which:

FIG. 1 is a diagrammatic section through a portion of a semiconductor electric circuit device for explaining the function of two of the three layers of metallization, and FIG. 2 is a diagrammatic section through a portion of an illustrative embodiment of a semiconductor electric device in accordance with the invention.

FIG. 1 shows, in section, a part of a semiconductor electric circuit device constituted as a monolithic integrated circuit that has a monocrystal semiconductor wafer body 10 of silicon. The body 10 consists mainly of a substrate 11 and an epitaxial layer 13 that is grown on the substrate 11 in manufacture. Between the epitaxial layer 13 and the substrate 11 is a conductive layer produced by diffusion of a suitable impurity and this layer is interrupted in a few places not shown in the drawing, so that in such places the substrate 11 and the epitaxial layer 13 come together at a common boundary.

In the epitaxial layer 13, there is a zone 14 that has been produced by diffusion of a suitable significant impurity, which zone accordingly has a different conductivity or a different conductivity type compared to the corresponding quality of the epitaxial layer 13. The semiconductor body 10 is covered with a silicon oxide layer 15 on the surface of the body in which the zone 14 has been diffused. As partly shown in the righthand portion of FIG. 1, a contact window has been etched through the insulating layer 15 above the zone 14 of the semiconductor body. The system consisting of the semiconductor body 10 and the silicon oxide layer 15 is partly covered with a metallization 16. This metallization 16 forms an ohmic contact with the zone 14 over part or all of the contact window above mentioned and serves to provide electrical connection between the zone 14 and other zones provided in the semiconductor body 10 in portions of that body that are not shown in the drawing.

The metallization layer 16 also serves to provide an external connection for the zone 14. For this purpose, a bonding wire 17 is provided that has been press-bonded with the metallization layer 16 at or near its end and leads to a circuit point, not shown in the drawing, that is beyond the edge of the semiconductor body 10. The bonding wire 17 is an aluminum wire and has a thickness equal to or greater than 50 μm.

In order to prevent the formation of bond slivers at the time of bonding, the metallization 16, in the illustrative embodiment shown in FIG. 1, is made up of two distinct layers, an outer layer of highly pure aluminum facing the bonding wire 17 and an underlying layer 16b consisting of copper-bearing aluminum with a copper content of from 1 to 4%. The outer layer 16 has a thickness between 0.5 and 1.5 μm and the underlying layer 16b likewise has a thickness of 0.5 to 1.5 μm.

FIG. 2 shows the three-layer metallization 16 of the present invention that contains, in addition to the outer layer 16a and the layer 16b immediate underlying the outer layer, a third layer 16c serving as an adhesion-providing layer, for improving the adhesion of the metallization 16 to the system 10,15 lying below it. The adhesion-providing layer 16c consists of aluminum and can advantageously contain up to 1% of silicon. The adhesion-providing layer 16c has a thickness between 0.3 and 0.5 μm.

Although the invention has been described with respect to particular illustrative embodiments, it is to be understood that the invention is not strictly limited thereto. Thus, for example, another aluminum layer of different additive metal content could be provided, in addition to the copper-bearing aluminum layer, between the inner and outer aluminum layers 16c and 16a of FIG. 3 without departing from the present inventive concept.

We claim:

1. A semiconductor electric circuit device having a monocrystalline silicon wafer body having zones of different conductivity and/or conductivitity type in various surface areas of said body for provision of components of said circuit device and being partly covered by an insulating layer which leaves uncovered, by windows therein, areas of said body or zones thereof for contact therewith, said body being also partly covered, above said insulating layer where the latter also covers the body, with a patterned metallization layer providing circuit paths, contact with said body or zones thereof through said windows, and areas for external contact application, and further including in order to prevent the occurrence of short-circuiting slivers at bonds with aluminum wires, the improvement, in accordance with the invention, that:

said metallization layer is composed of at least three distinct layers, comprising:

an outer layer (16a) of highly pure aluminum, an underlying layer (16b) of copper-containing aluminum having a copper content of between 1 and 4% by weight, and an inner layer (16c) of aluminum underlying said first-mentioned underlying layer (16b), said aluminum layer having a content by weight, from 0 to 1%, inclusive, of silicon.

2. A semiconductor electric circuit device as defined in claim 1, in said adhesion-providing inner layer (16c) is of silicon-bearing aluminum having a silicon content not exceeding 1% by weight.

3. A semiconductor electric circuit device as defined in claim 1, in which said outer layer (16a) has a thickness not less than 0.5 $\mu$m and not than more than 1.5 $\mu$m.

4. A semiconductor electric circuit device as defined in claim 1, in which said underlying layer (16b) has a thickness not less than 0.5 $\mu$m and not greater than 1.5 $\mu$m.

5. A semiconductor electric circuit device as defined in claim 1, in which said adhesion-providing inner layer (16c) has a thickness not less than 0.3 $\mu$m and not greater than 0.5 $\mu$m.

6. A semiconductor electric circuit device as defined in claim 1, having bonding wires (17) of aluminum wire bonded to said metallization layer at said outer layer (16a) thereof.

7. A semiconductor electric circuit device as defined in claim 6, in which said aluminum bonding wires (17) have a thickness not less than 50 $\mu$m.

* * * * *